United States Patent
Kim et al.

(10) Patent No.: US 6,461,924 B2
(45) Date of Patent: Oct. 8, 2002

(54) MOS TRANSISTOR FOR HIGH-SPEED AND HIGH-PERFORMANCE OPERATION AND MANUFACTURING METHOD THEREOF

(75) Inventors: Hyun-Sik Kim, Seongnam; Heon-Jong Shin; Soo-Cheol Lee, both of Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/847,639

(22) Filed: May 2, 2001

(65) Prior Publication Data

US 2001/0018255 A1 Aug. 30, 2001

Related U.S. Application Data

(62) Division of application No. 09/198,230, filed on Nov. 23, 1998, now Pat. No. 6,274,906.

(30) Foreign Application Priority Data

Nov. 25, 1997 (KR) .............................. 97-62573

(51) Int. Cl.$^7$ ............................................. H01L 21/336
(52) U.S. Cl. ..................... 438/305; 438/197; 438/299; 438/301; 438/303; 438/306; 438/302
(58) Field of Search ................................. 438/197, 217, 438/289, 290, 291, 299, 301, 302, 303, 305, 306

(56) References Cited

U.S. PATENT DOCUMENTS

| | | | | |
|---|---|---|---|---|
| 5,171,700 A | * | 12/1992 | Zamanian | 438/305 |
| 5,498,555 A | * | 3/1996 | Lin | 438/302 |
| 5,733,792 A | * | 3/1998 | Masuoka | 438/302 |
| 5,747,373 A | * | 5/1998 | Chen-Hua | 438/305 |
| 5,759,901 A | * | 6/1998 | Loh et al. | 438/305 |
| 5,776,806 A | * | 7/1998 | Dennison et al. | 438/199 |
| 5,822,242 A | * | 10/1998 | Chen | 365/185.01 |
| 5,847,428 A | * | 12/1998 | Fulford, Jr. et al. | 257/344 |
| 5,869,879 A | * | 2/1999 | Fulford, Jr. et al. | 257/510 |
| 6,004,851 A | * | 12/1999 | Peng | 438/301 |
| 6,096,586 A | * | 8/2000 | Milic-Strkalj et al. | 438/174 |

* cited by examiner

Primary Examiner—Carl Whitehead, Jr.
Assistant Examiner—Maria Guerrero
(74) Attorney, Agent, or Firm—Mills & Onello LLP

(57) ABSTRACT

A MOS transistor of the present invention includes a semiconductor substrate of a first conductivity type impurity, a gate insulating layer formed on the semiconductor substrate, gate electrodes formed on the gate insulating layer, and an oxide layer formed by surface oxidation of the gate electrodes. A first spacer is formed on the side wall of the gate electrodes, and a second spacer is formed on the inclined side wall. A first impurity layer of low concentration is formed at a first depth by a second conductivity type impurity implanted in the vicinity of surface of the semiconductor substrate to be self-aligned at the edge of the gate electrode. A second impurity layer of middle concentration is formed at a deeper second depth than the first depth by the second conductivity type impurity implanted in the vicinity of surface of the semiconductor substrate. A third impurity layer having higher impurity concentration than that of the semiconductor, is formed at a third depth for surrounding the second impurity layer of middle concentration by a first conductivity type impurity implanted in the vicinity of surface of the semiconductor substrate to be self-aligned at the edge of the first spacer. A fourth impurity layer of high concentration formed at a fourth depth deeper than the third depth by the second conductivity type impurity implanted in the vicinity of the surface of the semiconductor substrate to be aligned at the edge of the second spacer.

5 Claims, 3 Drawing Sheets

MOS TRANSISTOR FOR HIGH-SPEED AND HIGH-PERFORMANCE OPERATION AND MANUFACTURING METHOD THEREOF

RELATED APPLICATIONS

This application is a divisional of U.S. application Ser. No. 09/198,230, filed on Nov. 23, 1998 now U.S. Pat. No. 6,274,906, the contents of which are incorporated herein in their entirety by reference.

BACKGROUND OF THE INVENTION

1. Field of the Invention

The present invention relates to a MOS transistor and a manufacturing method thereof by which a short channel phenomenon caused by miniaturization of the device is suppressed and high speed operation can be maintained.

2. Description of the Prior Art

With accelerated improvements in semiconductor manufacturing processes, devices such as MOS transistors have become miniaturized to on the order of a quarter micron in size. As a result, certain phenomena, including a short channel effect, can alter performance of devices.

The short channel effect refers to the reduction in transistor threshold voltage with reduced channel length. The threshold voltage of a small-sized transistor, i.e., channel length less than 0.4 $\mu$m, decreases exponentially with decreasing channel length. The effect occurs because a shorter channel has a relatively larger portion of its active region affected by the drain voltage as compared to the portion under the influence of the gate voltage. The effect may be mitigated somewhat by defining the minimum transistor size to be larger than the size of the transistor having the minimally acceptable voltage threshold characteristics.

The short channel effect can be interpreted with a one-dimensional charge sharing model. Also, an accurate model for interpreting the short channel effect has been realized with numerical value analysis according to two-dimensional potential barrier lowering.

Various approaches to mitigating the short channel effect have been realized. For example, the thickness of the gate oxide layer, the maximum width of the depletion layer below the gate and the dopant density of the substrate can be decreased. Also, it is important to form a shallow junction to inhibit the effect.

Accordingly, a shallow ion implantation approach was introduced in the field of ultra large-scale integration (ULSI). Also, shallow junctions can be realized by using a rapid thermal annealing (RTA) process for heat treatment. As a result of these techniques, the short channel MOS transistor is taking preliminary steps to its introduction into mass production.

However, in spite of the introduction of the techniques for forming the shallow junction, the conventional techniques for the shallow junction are considered to have approached the limits of their applicability to high density, high integration devices in mass production, particularly as devices sizes approach a quarter-micron.

The conventional MOS transistor is generally modeled with a lightly doped drain (LDD) structure. Such an LDD structure is deposited on a moderate doped drain (MDD) in a shallow junction structure. The MDD structure compared with the LDD structure has enhanced the performance of the device by widenning a dopant level of the LDD region from $1 \times 10^{14}/cm^2$ to $1 \times 10^{15}/cm^2$. However, there is a problem in that the short channel effect according to short-channelization is mainly caused by the enhancement of the doping level in the MDD region.

SUMMARY OF THE INVENTION

Accordingly, the present invention is provided to solve the aforementioned problems and it is an object of the present invention to provide a MOS transistor with high-speed and high-performance operation and a manufacturing method thereof by which the short-channel effect caused by miniaturization of the device can be prevented.

In accordance with the present invention, there is provided a MOS transistor. The transistor of the invention includes a semiconductor substrate doped with a first conductivity type impurity, a gate insulating layer formed on the semiconductor substrate, gate electrodes formed on the gate insulating layer, and a dielectric layer formed on the gate electrode. A first spacer is formed around the gate electrodes, and a second spacer is formed on a first side wall of the first spacer. A first impurity layer of low concentration is formed at a first depth by a second conductivity type impurity implanted in the semiconductor substrate to be self-aligned at the edge of the gate electrode. A second impurity layer of middle concentration is formed in a deeper second depth than the first depth by the second conductivity type impurity implanted in the semiconductor substrate to be self-aligned at the edge of the first spacer. A third impurity layer having higher impurity concentration than that of the semiconductor is formed at a third depth for surrounding the second impurity layer of middle concentration by a first conductivity type impurity implanted in the semiconductor substrate to be self-aligned at the edge of the first spacer. A fourth impurity layer of high concentration is formed at a deeper fourth depth than the third depth by the second conductivity type impurity implanted in the semiconductor substrate to be self-aligned at the edge of the second spacer.

In addition, in accordance with another aspect, the present invention provides a method for manufacturing a MOS transistor. The method includes forming a gate insulating layer doped with a first conductivity type impurity, forming gate electrodes on the gate insulating layer, and forming a dielectric layer on the gate electrodes. The method further includes forming a first impurity layer of low concentration having a first depth by implanting a second conductivity type impurity in the semiconductor substrate to be self-aligned at the edge of the gate electrodes. A first spacer is formed on the side wall of the gate electrodes. A second impurity layer of middle concentration is formed at a deeper second depth than the first depth by implanting the second conductivity type impurity in the semiconductor substrate. A third impurity layer having higher impurity concentration than that of the semiconductor is formed at a third depth for surrounding the second impurity layer of middle concentration by implanting a first conductivity type impurity in the semiconductor substrate to be self-aligned at the edge of the first spacer. A second spacer is formed in the side wall of the first spacer, and a fourth impurity layer of high concentration is formed at a deeper fourth depth than the third depth by implanting the second conductivity type impurity in the semiconductor substrate to be aligned at the edge of the second spacer.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF A PREFERRED EMBODIMENT OF THE INVENTION

Figure 1:
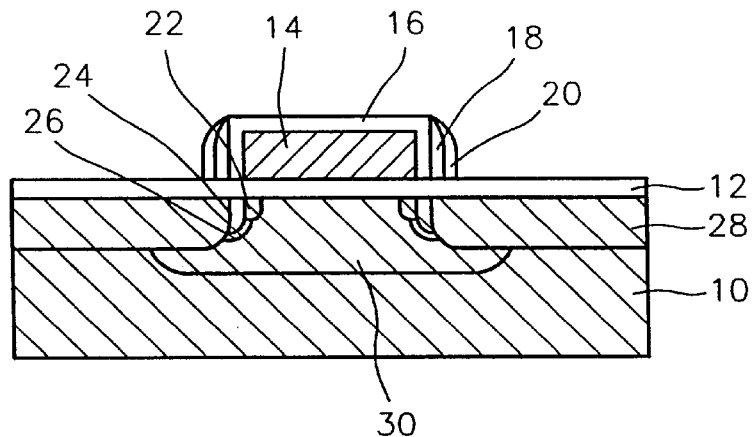
FIG. 1 is a schematic cross-sectional view illustrating one embodiment of a structure of a MOS transistor for high-speed operation and high performance according to the present invention.

FIG. 1 is a schematic cross-sectional diagram of one embodiment of the MOS transistor of the invention. As shown in FIG. 1, the MOS transistor according to the present invention comprises a semiconductor substrate 10 which can be doped with a P-type impurity (a first conductivity type). A gate insulating layer 12 is formed on the semiconductor substrate 10, and a gate electrode 14 is formed on the gate insulating layer 12. A dielectric layer 16 is formed on the gate electrode 14. A first spacer 18 is formed around the gate electrode 14, and a second spacer 20 is formed at the first side wall of the first spacer 18. A LDD region 22 of a first low-concentration impurity layer having a first depth, a MDD region 24 of a second middle-concentration impurity layer having a deeper second depth than the first depth, a P-type pocket 26 of a third impurity layer having a higher impurity concentration than the impurity concentration of the semiconductor substrate 10, and a source/drain region 28 of a high-concentration fourth impurity layer are all formed as shown.

The LDD region 22 is formed by implanting a N-type impurity, (a second conductivity type) in the semiconductor substrate 10 to be self-aligned at the edge of the gate electrode 14. The MDD region 24 is formed by allowing impurity of the second conduction type impurity to be implanted in the semiconductor substrate 10 to be self-aligned at the edge of the first spacer 18. The pocket 26 is formed by implanting the first conduction type impurity in the semiconductor substrate 10 and has a third depth to allow the second impurity layer 24 to be surrounded. The source/drain region 28 is formed by implanting the second conductivity type impurity in the semiconductor substrate 10 to be self-aligned at the edge of the second spacer 20.

Reference numeral 30 in FIG. 1 represents an impurity ion-implanted region for preventing punch-through and controlling threshold voltage in the channel region. In one embodiment, the dielectric layer 16 of the gate electrode 14 is 3 to 8 nm thick, the first spacer 18 is 10 to 30 nm in width, and the second spacer 20 is 50 to 100 nm in width. The LDD region 22 can be formed by an ion implantation defined in the range of $1\times10^{13}$ to $1\times10^{14}/cm^2$ in concentration, 15 to 30 KeV in energy and an inclination angle of 7–45 degrees. The MDD region 24 can be formed by an ion implantation defined in the range of $1\times10^{14}$ to $1\times10^{15}/cm^2$, 20–30 KeV in energy and an inclination angle of 7–45 degrees. The P-type pocket 26 can be formed by an ion implantation defined in the range of $2\times10^{12}$ to $2\times10^{13}/cm^2$ in concentration, 20 to 40 KeV in energy and an inclination angle of 7 to 45 degrees. The source/drain region 28 can be formed by an ion implantation defined in the range of $1\times10^{15}$ to $5\times10^{15}/cm^2$ in concentration and 10 to 50 KeV in energy.

FIGS. 2 to 6 show schematic cross-sectional views illustrating the order of the process for manufacturing the MOS transistor according to one embodiment of the present invention. With reference to FIGS. 2 to 6, the manufacturing method of the present invention will be described.

Figure 2:
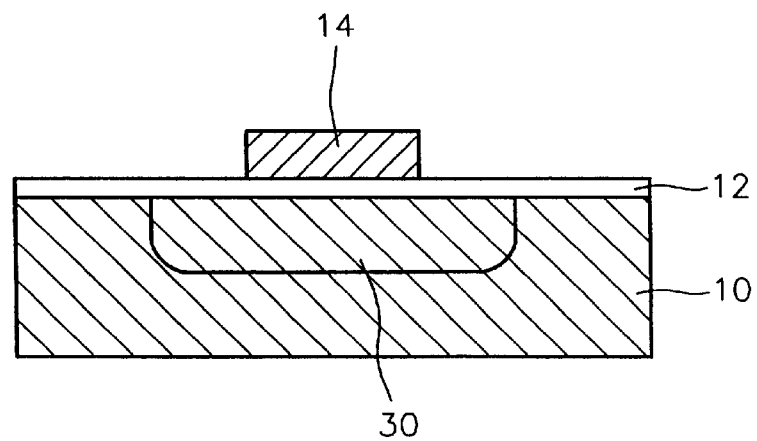
FIGS. 2 to 6 are schematic cross-sectional views illustrating the steps in one embodiment of a process for manufacturing the MOS transistor in FIG. 1, according to the present invention.

Referring to FIG. 2, a buffer oxide layer is formed on the P-type semiconductor substrate 10 to about a 15 nm thickness. Then the ion implantation for controlling threshold voltage and the ion implantation for preventing a punch-through are carried out to thereby form the impurity layer 30.

Subsequently, the buffer oxide layer is removed and the gate insulating layer 12 is formed on the surface of the substrate 10. Polysilicon is deposited on the gate insulating layer 12, and the deposited polysilicon is processed by means of a photolithography process to form the gate electrode 14.

Figure 3:
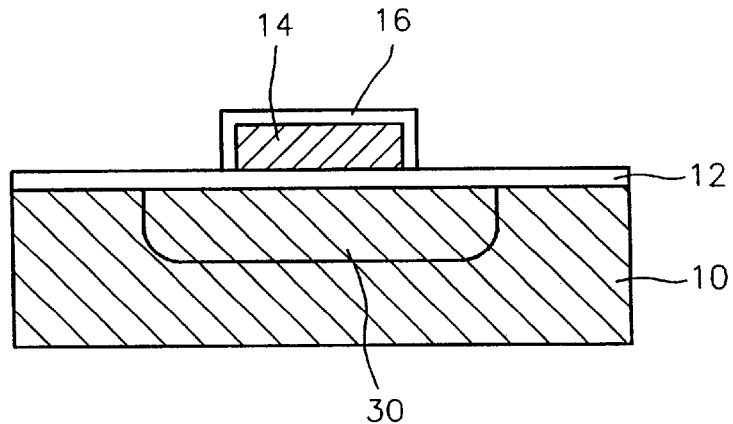

Referring to FIG. 3, the surface of the gate electrode 14 formed in the polysilicon is oxidized and the dielectric layer 16 is formed in the 3 to 8 nm range of thickness.

Figure 4:
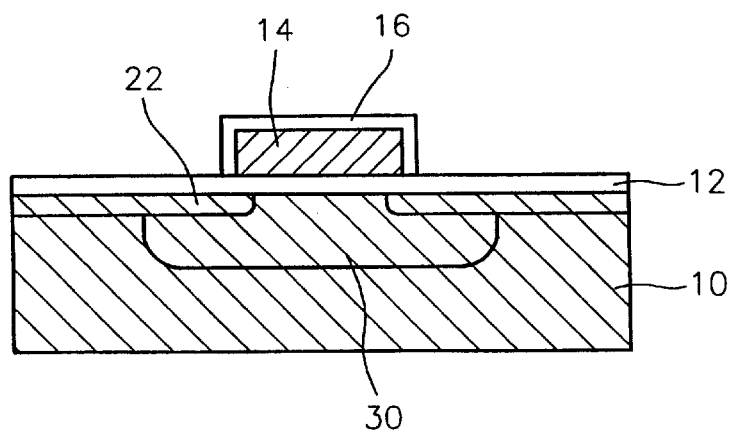

As shown in FIG. 4, the first impurity layer of low concentration, that is, the LDD region 22, is formed about the surface of the semiconductor substrate 10 to be self-aligned at the edge of the surface-oxidized gate electrode 14 by carrying out ion implantation of the second conductivity type impurity, for example, arsenic, in the range of $1\times10^{13}$ to $1\times10^{14}/cm^2$ in concentration, 15 to 30 KeV in energy and an inclination angle of 7 to 45 degrees.

The LDD region 22 and the gate poly 14 are allowed to overlap one another as shown. At this location, if the vertical junction depth of the LDD region is more than 60 nm when compared with the edge of the gate poly 14, it would be possible for surface punch-through to occur. Accordingly, it is desirable to form the vertical junction of the LDD region 22 within about the 60 nm depth.

Figure 5:
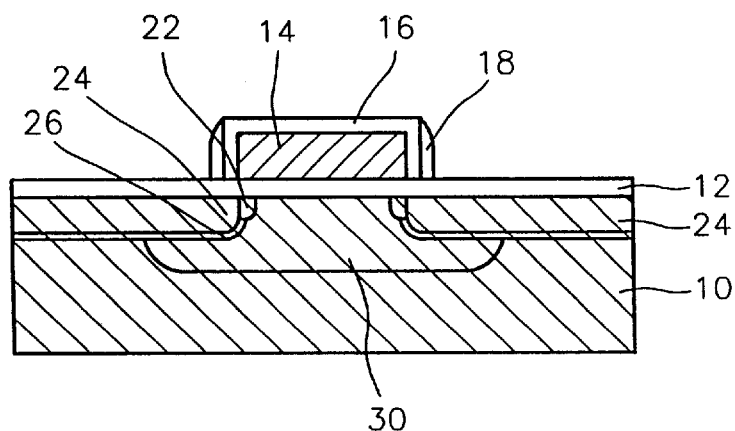

Referring to FIG. 5, the insulating layer is first deposited on the entire surface of the resulting product in the 10 to 30 nm thickness range, and then the first spacer 18 is formed on the side wall of the gate electrode 14 by an etch back process.

Next, the second conduction impurity layer of middle concentration having the second depth thicker than the first depth, that is, the MDD region 24, is formed so as to be self-aligned at the edge of the first spacer 18 by carrying out ion implantation of the second conductivity type impurity, for example, arsenic or antimony, in the range of $1\times10^{14}$ to $1\times10^{15}/cm^2$ in concentration, 20 to 30 KeV in energy and an inclination angle of 7 to 45 degrees.

When the MDD region 24 and the gate poly overlap one another, high electric field is generated at the semiconductor substrate 10 below the edge of the gate poly. The high electric field causes the hot carrier effect, thereby resulting in deterioration of the properties of the device. Accordingly, the MDD region 24 and the gate poly are formed without overlapping therebetween at the side extended region, and the vertical junction depth of the MDD region 24 is allowed to be extended so as to become thicker than that of the LDD region 22. In this case, a parasitic resistance can be reduced much more than in the case in which the vertical junction depth of the MDD region 24 is formed at the same thickness as that of the LDD region 22. Electric current is increased such that the saturation current of the drain increases.

In addition, the third impurity layer, i.e., the P-type pocket 26, is formed around the surface of the semiconductor substrate 10. The P-type pocket 26 has a higher impurity concentration than the impurity concentration of the semiconductor substrate 10 and has the third depth enclosing the MDD region 24. It can be formed by ion implantation of the first conduction impurity, that is, the P-type impurity, in the range of $2\times10^{12}$ to $2\times10^{13}$/cm$^2$ in concentration, 20 to 40 KeV in energy and an inclination angle of 7 to 45 degrees to be self-aligned at the edge of the first spacer 18.

In case the LDD region 22 is enclosed by the side region of the P-type pocket 26, the impurity concentration of the channel region could be locally changed, thereby resulting in change of the threshold voltage property. Therefore, in one embodiment, the side region of the P-type pocket 26 is prevented from being inwardly extending beyond the LDD region 22.

In addition, in case the vertical junction depth of the P-type pocket 26 is formed deeper than that of the MDD region 24 and thus the N+ region is enclosed by it, extension of the depletion region must be prevented, thereby resulting in increase of the junction capacitance in the N+ region. Thus, in one embodiment, the vertical junction depth is prevented from being formed deeper than that of the MDD region 24, and the N+ region is accordingly enclosed.

Figure 6:
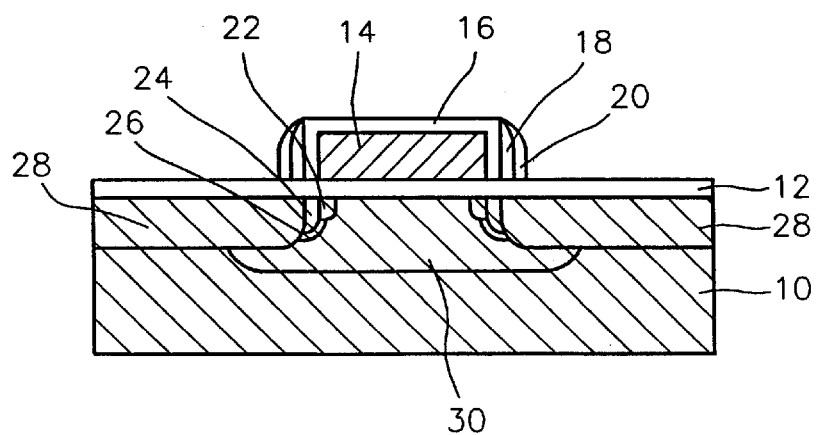

Referring to FIG. 6, the insulating layer is first deposited on the whole surface of the resulting product in the 50 to 100 nm thickness range, and then the second spacer 20 is formed on the first side wall of the first spacer 18 by an etch back process. Next, around the surface of the semiconductor substrate 10 is formed the fourth impurity layer, that is, the source/drain region 28, having the fourth depth deeper than the third depth by ion implantation of the second conductivity impurity, that is, the N-type impurity, in the range of $2\times10^{15}$ to $5\times10^{15}$/cm$^2$ in concentration and 10 to 50 KeV in energy to be self-aligned at the edge of the second spacer 20. Then, the implanted impurity can be activated by heat-processing for 30 minutes at the temperature 1000° C. through RTP technique.

As described above, according to the present invention, the MDD region of middle concentration is formed between the the LDD region of low concentration and the source and drain regions of high concentration. Horizontal resistance of the LDD can be reduced by the LDD region, thereby causing the drain saturation current to be increased, and the MOS transistor for high speed and high performance is realized. Furthermore, the maximum value of electric field in a MOS transistor on the order of a quarter micron in size can be reduced around the drain region of the gate edge by the LDD region. Also, there is a further advantage in the present invention in that shallow junctions of the LDD region and the MDD region are formed in the vertical direction because the MDD region is enclosed by the P-type pocket region, and the punch-through phenomenon can be inhibited by the MDD region and the source/drain region, thereby reducing the short channel effect.

While this invention has been particularly shown and described with reference to the preferred embodiments thereof, it will be understood by those skilled in the art that various changes in form and details may be made without departing from the spirit and scope of this invention as defined by the appended claims.

For example, the present invention can be applied to a P-MOS transistor as well as the N-MOS transistor. In the case when the P-MOS transistor is used to, impurity of the first impurity layer 22 can be, for example, boron or BF$_2$ and the impurity of the second impurity layer 24 can be BF$_2$ or In.

What is claimed is:

1. A method for manufacturing a MOS transistor, comprising the steps of:

forming a gate insulating layer on a surface of a semiconductor substrate doped with a first conductivity type-impurity;

forming a gate electrode on the gate insulating layer;

forming a dielectric layer on the gate electrode;

implanting a second conductivity type-impurity in the semiconductor substrate to be self-aligned at the edge of the gate electrodes, thereby forming a first impurity layer of low concentration having a first depth;

forming a first spacer on a side wall of the gate electrode;

forming a second impurity layer of middle concentration having a second depth deeper than the first depth by implanting the second conductivity type-impurity in the semiconductor substrate;

forming a third impurity layer having a higher impurity concentration than that of the semiconductor substrate by implanting a first conductivity type-impurity in the semiconductor substrate to be self-aligned at the edge of the first spacer, the third impurity layer having a third depth and extending underneath and along a side of the second impurity layer to at least partially surround the second impurity layer;

forming a second spacer in a side wall of the first spacer; and forming a fourth impurity layer of high concentration having a fourth depth deeper than the third depth by implanting the second conductivity type-impurity in the semiconductor substrate to be self-aligned at the edge of the second spacer.

2. The method as defined in claim 1, wherein the first impurity layer is formed by ion implantation of $1\times10^{13}$ to $1\times10^{14}$/cm$^2$ in concentration, 15 to 30 KeV in energy and an inclination angle of 7 to 45 degrees.

3. The method as defined in claim 1, wherein the second impurity layer is formed by ion implantation of $1\times10^{14}$ to $1\times10^{15}$/cm$^2$ in concentration, 20 to 30 KeV in energy and an inclination angle of 7 to 45 degrees.

4. The method as defined in claim 1, wherein the third impurity layer is formed by means of ion implantation of $2\times10^{12}$ to $2\times10^{13}$/cm$^2$ in concentration, 20 to 40 KeV in energy and an inclination angle of 7 to 45 degrees.

5. The method as defined in claim 1, wherein the fourth impurity layer is formed by ion implantation of $1\times10^{15}$ to $5\times10^{15}$/cm$^2$ in concentration, 10 to 50 KeV in energy and an inclination angle of 7 to 45 degrees.

* * * * *